(12) United States Patent
Wang et al.

(10) Patent No.: US 7,221,193 B1
(45) Date of Patent: May 22, 2007

(54) ON-CHIP TERMINATION WITH CALIBRATED DRIVER STRENGTH

(75) Inventors: Xiaobao Wang, Cupertino, CA (US); Tzung-Chin Chang, San Jose, CA (US); Chiakang Sung, Milipitas, CA (US); Khai Q. Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 11/040,048

(22) Filed: Jan. 20, 2005

(51) Int. Cl.
 *H03B 1/00* (2006.01)
(52) U.S. Cl. .......................... 327/108; 327/112; 326/30
(58) Field of Classification Search ................ 327/306, 327/309, 108, 112; 326/30, 87
 See application file for complete search history.

(56) References Cited

U.S. PATENT DOCUMENTS

| | | | |
|---|---|---|---|
| 4,719,369 A | 1/1988 | Asano et al. .................. 326/30 |
| 4,954,729 A | 9/1990 | Urai ............................. 326/27 |
| 5,111,081 A | 5/1992 | Atallah ......................... 326/32 |
| 5,134,311 A | 7/1992 | Biber et al. .................. 327/108 |
| 5,164,663 A | 11/1992 | Alcorn ......................... 714/734 |
| 5,179,300 A | 1/1993 | Rolandi et al. .............. 326/83 |
| 5,359,235 A | 10/1994 | Coyle et al. ................ 327/108 |
| 5,374,861 A | 12/1994 | Kubista ........................ 326/30 |
| 5,592,510 A | 1/1997 | Van Brunt et al. .......... 375/220 |
| 5,602,494 A | 2/1997 | Sundstrom .................... 326/39 |
| 5,623,216 A | 4/1997 | Penza et al. .................. 326/27 |
| 5,656,953 A | 8/1997 | Whetsel ........................ 326/83 |
| 5,726,582 A | 3/1998 | Hedberg ........................ 326/30 |
| 5,726,583 A | 3/1998 | Kaplinsky .................... 326/30 |
| 5,764,080 A | 6/1998 | Huang et al. ................. 326/41 |
| 5,864,715 A | 1/1999 | Zani et al. .................... 710/63 |
| 5,939,896 A | 8/1999 | Hedberg ........................ 326/30 |
| 5,955,911 A | 9/1999 | Drost et al. .................. 327/404 |
| 5,970,255 A | 10/1999 | Tran et al. ..................... 710/73 |
| 6,008,665 A | 12/1999 | Kalb et al. .................... 326/30 |
| 6,020,760 A | 2/2000 | Sample et al. ................ 326/41 |
| 6,026,456 A | 2/2000 | Ilkbahar ....................... 710/100 |
| 6,037,798 A | 3/2000 | Hedberg ........................ 326/30 |
| 6,049,255 A | 4/2000 | Hagberg et al. .............. 331/17 |
| 6,064,224 A | 5/2000 | Esch, Jr. et al. ............. 326/30 |
| 6,087,847 A | 7/2000 | Mooney et al. .............. 326/30 |
| 6,097,208 A | 8/2000 | Okajima et al. ............. 326/26 |
| 6,100,713 A | 8/2000 | Kalb et al. .................... 326/30 |
| 6,118,310 A | 9/2000 | Esch .......................... 327/108 |
| 6,147,520 A | 11/2000 | Kothandaraman et al. .... 327/77 |
| 6,154,060 A | 11/2000 | Morriss ........................ 326/86 |
| 6,157,206 A | 12/2000 | Taylor et al. ................. 326/30 |

(Continued)

OTHER PUBLICATIONS

"Apex 20K Programmable Logic Device Family ver. 3.7," product data sheet Altera Corporation, San Jose, CA (May 2001).

(Continued)

*Primary Examiner*—Timothy P. Callahan
*Assistant Examiner*—Hai L. Nguyen
(74) *Attorney, Agent, or Firm*—Townsend and Townsend and Crew LLP

(57) ABSTRACT

Techniques are provided for controlling an on-chip termination resistance in an input or output (IO) buffer using calibration circuits. Each calibration circuit monitors the voltage between an external resistor and a group of on-chip transistors. When the effective resistance of the group of transistors matches the external resistance, the calibration circuit causes the effective resistance of drive transistors in the IO buffer to match the effective resistance of the group of on-chip transistors.

24 Claims, 4 Drawing Sheets

U.S. PATENT DOCUMENTS

| | | | |
|---|---|---|---|
| 6,181,157 B1 | 1/2001 | Fiedler | 326/30 |
| 6,236,231 B1 | 5/2001 | Nguyen | 326/39 |
| 6,252,419 B1 | 6/2001 | Sung et al. | 326/38 |
| 6,281,687 B1 * | 8/2001 | Shepston | 324/601 |
| 6,307,791 B1 * | 10/2001 | Otsuka et al. | 365/189.05 |
| 6,329,836 B1 | 12/2001 | Drost et al. | 326/30 |
| 6,356,106 B1 | 3/2002 | Greeff et al. | 326/30 |
| 6,362,644 B1 | 3/2002 | Jeffery et al. | 326/30 |
| 6,366,128 B1 | 4/2002 | Ghia et al. | 326/83 |
| 6,411,126 B1 | 6/2002 | Tinsley et al. | 326/83 |
| 6,414,512 B1 | 7/2002 | Moyer | 326/30 |
| 6,424,169 B1 | 7/2002 | Partow et al. | 326/30 |
| 6,433,579 B1 | 8/2002 | Wang et al. | 326/38 |
| 6,445,245 B1 | 9/2002 | Schultz et al. | 327/541 |
| 6,448,813 B2 | 9/2002 | Garlepp et al. | 326/83 |
| 6,466,063 B2 | 10/2002 | Chen | 327/112 |
| 6,489,837 B2 | 12/2002 | Schultz et al. | 327/541 |
| 6,504,397 B1 | 1/2003 | Hart et al. | 326/30 |
| 6,549,036 B1 * | 4/2003 | Lee | 326/93 |
| 6,573,747 B2 * | 6/2003 | Radhakrishnan | 326/30 |
| 6,586,964 B1 | 7/2003 | Kent et al. | 326/30 |
| 6,590,413 B1 | 7/2003 | Yang | 326/30 |
| 6,603,329 B1 | 8/2003 | Wang et al. | 326/30 |
| 6,605,958 B2 | 8/2003 | Bergman et al. | |
| 6,636,821 B2 * | 10/2003 | Lawson | 702/107 |
| 6,639,397 B2 | 10/2003 | Roth et al. | 324/158.1 |
| 6,642,741 B2 | 11/2003 | Metz et al. | 326/30 |
| 6,700,823 B1 | 3/2004 | Rahman et al. | 365/189.5 |
| 6,710,618 B1 | 3/2004 | Murray | 326/30 |
| 6,747,475 B2 | 6/2004 | Yuffe et al. | 326/30 |
| 6,766,155 B2 | 7/2004 | Salcido et al. | 455/282 |
| 6,788,101 B1 | 9/2004 | Rahman | 326/30 |
| 6,836,144 B1 * | 12/2004 | Bui et al. | 326/32 |
| 6,919,738 B2 * | 7/2005 | Kushida | 326/82 |
| 6,947,336 B2 * | 9/2005 | Kim et al. | 365/189.05 |
| 7,038,486 B2 * | 5/2006 | Aoyama et al. | 326/30 |
| 2002/0010853 A1 | 1/2002 | Trimberger et al. | 713/1 |
| 2002/0060602 A1 | 5/2002 | Ghia et al. | 327/543 |
| 2002/0101278 A1 | 8/2002 | Schultz et al. | 327/543 |
| 2003/0062922 A1 | 4/2003 | Douglass et al. | 326/39 |
| 2004/0008054 A1 | 1/2004 | Lesea et al. | 326/30 |

OTHER PUBLICATIONS

"Apex II Programmable Logic Device Family ver. 1.1," product Data Sheet, Altera Corporation San Jose, Ca (May 2001).

Bendak et al. "CMOS VLSI Implementation of Gigabyte/second computer network links," proceedings of the 1996 IEEE International Symposium on Circuits and Systems 2:269-272 (May 1996).

Boni et al. "LVDS I/O Interface for Gb/s-per-Pin Operation in 0.35-um CMOS," IEEE Journal of Solid-State Circuits 38(4):706-711 (Apr. 2001).

Esch et al. "Theory and Design of CMOS HSTL I/O Pads,"The Hewlett Packard Journal, pp. 46-52 (Aug. 1998).

"Spartan-3 1.2V FPGA Family; Functional Description, CA DS099-2 (v1.2)," product specifications Xilinx, Inc., San Jose (Jul. 11, 2003).

"Virtex-II 1.5V Field Programmable Gate Arrays, DSO3102 (v1. 5)," product specifications Xilinx, Inc., San Jose, CA (Apr. 2, 2001).

"Virtex-II Platform FPGAs: Detailed Description, DS031-2 (v3.1)," product specifications Xilinx, Inc., San Jose, CA (Oct. 14, 2003).

"Virtex-II Pro Platform FPGAs: Functional Description, DS083-2 (v2.9)," product specifications Xilinx, Inc., San Jose, CA, (Oct. 14, 2003).

* cited by examiner

ON-CHIP TERMINATION WITH CALIBRATED DRIVER STRENGTH

CROSS-REFERENCES TO RELATED APPLICATIONS

This patent application is related to commonly-assigned, co-pending U.S. patent application Ser. No. 11/040,343, filed Jan. 20, 2005, by Chang et al., which is incorporated by reference herein.

BACKGROUND OF THE INVENTION

The present invention relates to techniques for controlling on-chip termination resistance using calibrated drive strength, and more particularly, to techniques for monitoring an effective resistance of on-chip transistors to control the drive strength provided to an input/output pin to provide on-chip termination impedance matching.

When transmitting signals over distances that are appreciable with respect to the signal period, mismatches between the impedance of the transmission line and that of the receiver cause signal reflection. The reflected signal interferes with the transmitted signal and causes distortion and degrades the overall signal integrity. To minimize or eliminate the unwanted reflection, transmission lines are resistively terminated by a matching impedance. In the case of integrated circuits that are in communication with other circuitry on a circuit board, termination is often accomplished by coupling an external termination resistor to the relevant input/output (I/O) pins.

For many of today's high speed integrated circuits, and particularly those that have large I/O pin counts, external termination poses a number of problems. A termination resistor is typically coupled to every I/O pin receiving an input signal from a transmission line. Often hundreds of termination resistors are needed for an integrated circuit. Numerous external termination resistors can consume a substantial amount of board space. The use of external components for termination purposes can be cumbersome and costly, especially in the case of an integrated circuit with numerous I/O pins.

Signal integrity is crucial in digital design because system speeds and clock edge rates continue to increase. To improve signal integrity, both single-ended and differential signals should be properly terminated. Termination can be implemented with external termination resistors on a board or with on-chip termination technology. On-chip termination eliminates the need for external resistors and simplifies the design of a circuit board.

It is desirable therefore to implement the termination resistance on-chip to reduce the number of external components. It is also desirable to provide on-chip termination for an I/O pin that matches an external resistor provided by a user.

BRIEF SUMMARY OF THE INVENTION

The present invention provides techniques for controlling an on-chip termination resistance in an input or output (IO) buffer using calibration circuits. Each calibration circuit monitors the voltage between an external resistor and a group of on-chip transistors. When the effective resistance of the group of on-chip transistors matches the external resistance, the calibration circuit causes the termination resistance of drive transistors in the IO buffer to match the effective resistance of the group of on-chip transistors.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
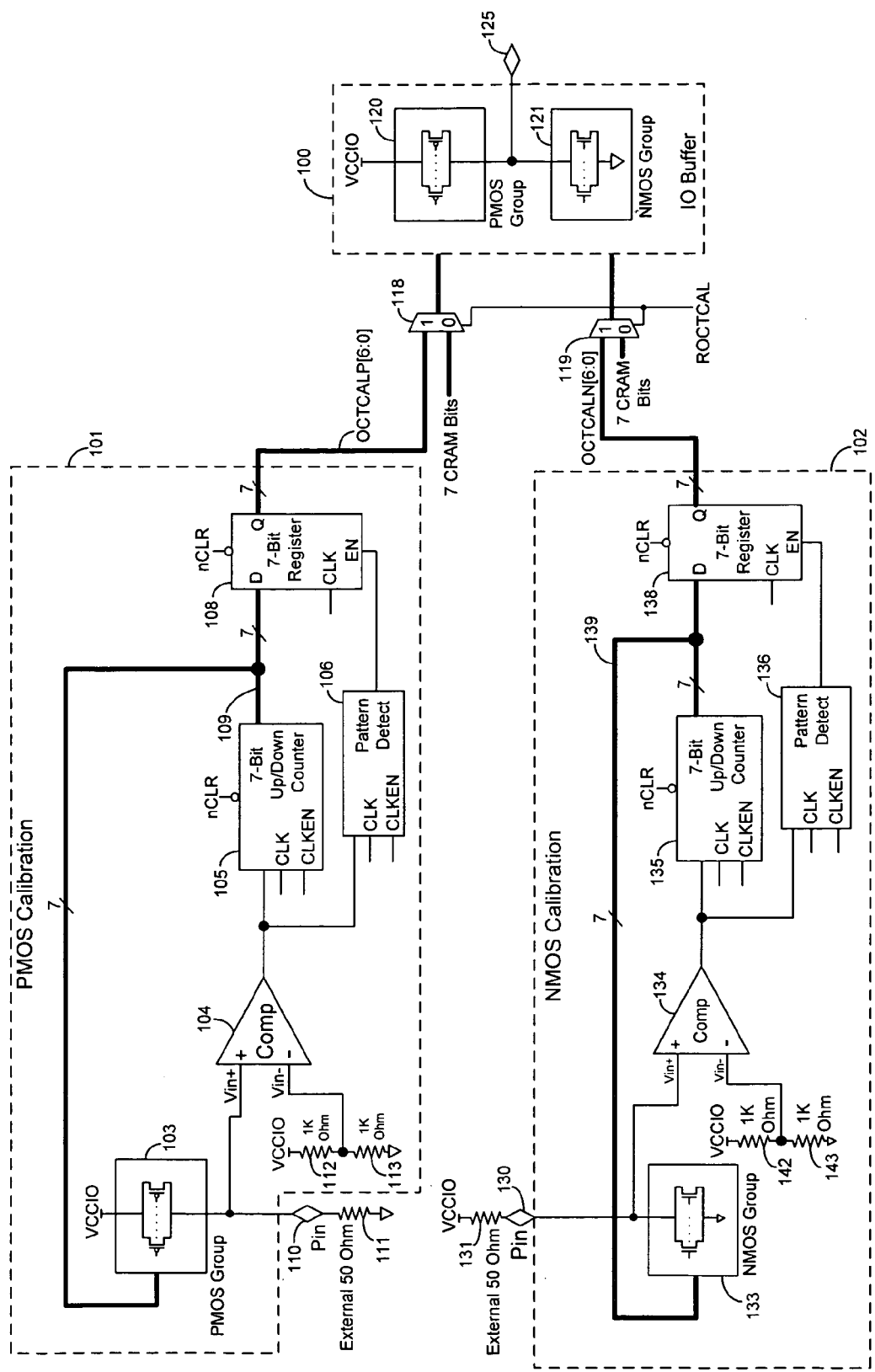
FIG. 1 illustrates calibration circuits that control the termination resistance in an IO buffer according to an embodiment of the present invention.

FIG. 1 illustrates a PMOS calibration circuit 101 and an NMOS calibration circuit 102 according to embodiments of the present invention. PMOS calibration circuit 101 controls the series termination resistance of pull-up PMOS transistors 120 in input/output (IO) buffer 100. NMOS calibration circuit 102 controls the series termination resistance of pull-down NMOS transistors 121 in IO buffer 100. Transistor groups 120 and 121 drive output signals to IO pin 125.

The transistors in groups 120 and 121 are binary-weighted, parallel-connected transistors. For example, transistor groups 120 and 121 can each have 7 transistors with channel width-to-length (W/L) ratios of 1×, 2×, 4×, 8×, 16×, 32×, and 64×. The transistors in groups 120 and 121 are controlled by configurable RAM (CRAM) bits or by calibration signals from circuits 101 and 102. The total drive current strength provided to pin 125 equals the sum of the transistor currents in driver 100. The impedance of driver 100 is inversely proportional to the driver strength.

PMOS calibration circuit 101 has a calibration pin 110, and NMOS calibration circuit 102 has a calibration pin 130. A user can couple an external resistor 111 to pin 110 to select the series termination resistance for the pull-up PMOS transistors in group 120. The user can couple an external resistor 131 to pin 130 to select the series termination resistance for the pull-down NMOS transistors in group 121.

The calibration circuits 101 and 102 cause the termination resistance of transistor groups 120 and 121 to match external resistors 111 and 131, respectively. For example, if a user couples 50 Ohm external resistors to calibration pins 110 and 130 as shown in FIG. 1, calibration circuits 101 and 102 cause transistor groups 120 and 121 to each have an effective resistance of about 50 Ohms. 50 Ohm resistors are shown in FIG. 1 merely as examples. Any suitable resistor values can be selected.

PMOS calibration block 101 has a group of PMOS transistors 103 that are coupled in parallel between pin 110 and supply voltage VCCIO. PMOS group 103 can have any desired number of transistors (e.g., 7). Transistors in group 103 have different channel width-to-length ratios (e.g., 1×, 2×, 4×, 8×, 16×, 32×, and 64×). Each transistor in PMOS group 103 is typically equivalent in size (channel W/L ratio) to a corresponding pull-up PMOS drive transistor in group 120.

The effective resistance of transistor group 103 can be varied by turning on different combinations of the PMOS transistors. The transistors in group 103 and external resistor 111 form a resistor divider. The positive input of comparator 104 is coupled to this resistor divider. Thus, comparator 104 receives the voltage Vin+ of the resistor divider at its positive input.

The effective resistance of transistor group 103 and resistor 111 control the voltage level at the positive input (Vin+) of comparator 104. Voltage Vin+ varies in response to turning on different combinations of the transistors in group 103. The negative input (Vin−) of comparator 104 receives a reference voltage that equals half the supply voltage VCCIO/2. The reference voltage is generated by resistors 112 and 113. The output of comparator 104 is coupled to an input of 7-bit up/down counter 105 and an input of pattern detect circuit 106. Counter 105 generates 7 digital count signals 109 at its outputs.

When the voltage Vin+ at the positive input of comparator 104 is less than the voltage at the negative input of comparator 104 (VCCIO/2), the output voltage of comparator 104 is low. When the output of comparator 104 is low, counter 105 causes the digital binary value of the 7 count signals 109 to decrease. For example, when the output of comparator 104 is low, the digital value of count signals 109 may decrease from 1111111 to 1111110 to 1111101, to 1111100, etc., where the ones and zeros correspond to digital high and low voltages, respectively.

The 7 count signals 109 control the gate voltages of the 7 transistors in PMOS transistor group 103. Typically, the least significant bit of the count signals controls the smallest sized transistor in group 103, and the most significant bit controls the largest transistor in group 103. When the binary value of the 7 count signals 109 decreases, the effective resistance of PMOS group 103 decreases.

If the voltage Vin+ at the positive input of comparator 104 exceeds the voltage at the negative input of comparator 104 (VCCIO/2), the output voltage of comparator 104 is high. When the output of comparator 104 is high, counter 105 causes the digital binary value of count signals 109 to increase. When the binary value of count signals 109 increases, the effective resistance of PMOS group 103 increases, as more of the transistors turn off.

Figure 2:
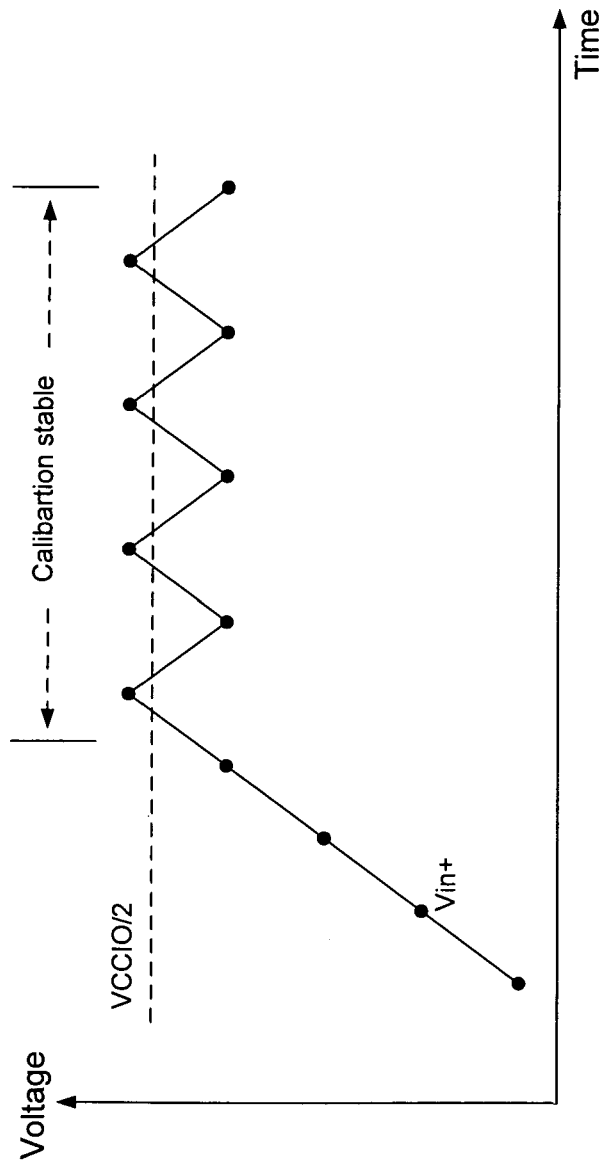
FIG. 2 is a graph that illustrates the voltage at the positive inputs of the comparators in FIG. 1, according to the present invention.

The voltage Vin+ at the positive input of comparator 104 increases until it rises above half the supply voltage VCCIO/2. After Vin+ initially rises above VCCIO/2, the calibration becomes stable, and voltage Vin+ oscillates across the VCCIO/2 threshold level as shown in the graph of FIG. 2. Each point on the Vin+ line of FIG. 2 corresponds to a particular binary value of count signals 109. When voltage Vin+ oscillates around VCCIO/2 as shown in FIG. 2, the effective resistance of PMOS group 103 has come as close to the resistance of external resistor 111 as calibration circuit 101 can get it.

Figure 3:
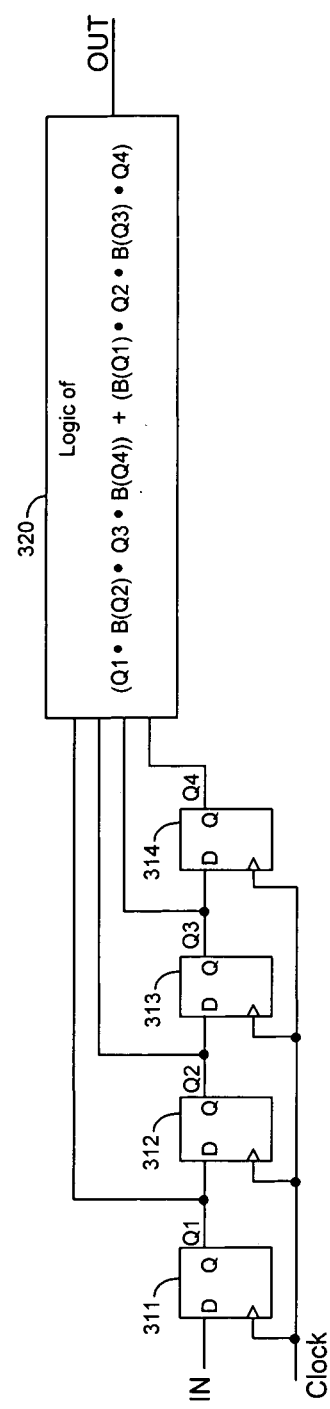
FIG. 3 illustrates an example of the pattern detect circuits shown in FIG. 1, according to an embodiment of the present invention.

A pattern detect circuit 106 in calibration circuit 101 detects the toggling output voltage of comparator 104 and enables register 108 to latch the values of count signals 109. FIG. 3 illustrates an example of pattern detect circuit 106. Pattern detect circuit 106 monitors the output voltage of comparator 104. When the output voltage of comparator 104 toggles between logic states 0→1→0→1 or 1→0→1→0, the output voltage of pattern detect circuit 106 goes high.

Thus, pattern detect circuit 106 looks for at least three high-to-low or low-to-high transitions in the output of comparator 104, indicating that Vin+ is oscillating above and below VCCIO/2 as shown in FIG. 2.

Serially coupled flip-flops 311–314 store the voltages at their D inputs on rising edges of the clock signal. The D input of flip-flop 311 is coupled to the output of comparator 104. The output voltages of flip-flops 311–314 are Q1–Q4, respectively. Block 320 contains logic gates that implement the logic function, (Q1·B(Q2)·Q3·B(Q4))+(B(Q1)·Q2·B(Q3)·Q4), where · refers to an AND function, + refers to an OR function, and B( ) refers to an inverse function.

The output signal OUT of pattern detect circuit 106 transitions from low to high when it detects the output voltage of comparator 104 satisfies the logic function of logic block 320. The output of circuit 106 is coupled to the enable input of register 108. Register 108 includes 7 serially coupled flip-flops that store the 7 count signals OCTCALP[6:0] on a rising edge of the output signal of pattern detect circuit 106. Count signals OCTCALP[6:0] can be transmitted through multiplexer 118 to IO buffer 100 to control the termination resistance of transistors in PMOS group 120.

The inputs of multiplexer 118 are coupled to the Q outputs of register 108 and 7 CRAM bits. The output signals of multiplexer 118 are transmitted to transistors in PMOS group 120 within IO buffer 100. A CRAM bit ROCTCAL determines whether multiplexer 118 selects signals OCTCALP[6:0] or the 7 CRAM bits to control the termination resistance of PMOS group 120.

Multiplexer 118 can be set to select the OCTCALP[6:0] signals when a user wants the termination resistance of PMOS group 120 to match the resistance of external resistor 111. When multiplexer 118 selects signals OCTCALP[6:0], PMOS group 120 has the same effective resistance as PMOS group 103, which is set to match resistor 111. When matching the resistance of PMOS group 120 to resistor 111, calibration circuit 101 compensates for silicon process, voltage, and temperature (PVT) variations on the integrated circuit. As a result, calibration circuit 101 can achieve a very accurate termination resistance (e.g., a +/− 10% variation).

The OCTCALP[6:0] signals can be used to control the termination resistance of pull-up transistors that are coupled to multiple pins. For example, the OCTCALP[6:0] signals can control the pull-up termination resistance for all of the IO pins in an IO bank.

Alternatively, multiplexer 118 can be set to select 7 CRAM bits to control the termination resistance of PMOS group 120. A user can set the CRAM bits to any desired value. The CRAM bits set the drive strength of PMOS group 120 in order to achieve a desired pull-up termination resistance (e.g., 25 Ohm or 50 Ohm). The CRAM termination control technique does not need a dedicated control circuit, and has zero cost in terms of die size.

To achieve a desired termination resistance (Rs) for PMOS group 120 (or NMOS group 121), a corresponding drive current is calculated at a pin voltage of ½ the supply voltage VCCIO using the equation: I=VCCIO/(2×Rs). For example, I=25 mA if VCCIO=2.5 volts and Rs=50 Ohm (i.e., set the driver strength to 25 mA at Vpin=½ VCCIO). This technique achieves a reasonably accurate termination resistance (+/−30% variation). The transistor resistance is calculated at VCCIO, because a signal of half the output voltage swing travels from the output buffer and is reflected at an open ended transmission line. The reflected waveform returns to the output buffer, and results in the full output swing, preventing the output signal from reflecting back-and-forth in the transmission line FIG. 1 also illustrates an NMOS calibration block 102. Multiplexer 119 can select the output signals OCTCALN[6:0] of NMOS calibration block 102 to control the termination resistance of transistors in NMOS group 121. The transistors in NMOS group 121 are pull-down transistors for IO pin 125.

Alternatively, multiplexer 119 can select 7 CRAM bits to control the termination resistance of NMOS group 121. Multiplexer 119 is control by CRAM bit ROCTCAL. A user can set the CRAM bits to any desired value. The CRAM bits set the drive strength of NMOS group 121 in order to achieve a desired pull-down termination resistance.

NMOS calibration circuit 102 operates in a similar manner to PMOS calibration circuit 101. NMOS calibration block 102 has a group of NMOS transistors 133 that are coupled in parallel between pin 130 and ground. An external resistor 131 can be coupled to pin 130.

Transistor group 133 can have any number of transistors (e.g., 7). Transistors in group 133 have different channel width-to-length ratios (e.g., 1×, 2×, 4×, 8×, 16×, 32×, and 64×). Each transistor in NMOS group 133 is typically equivalent in size (channel W/L ratio) to a corresponding pull-down NMOS drive transistor in group 121.

The positive input of comparator 134 is coupled to pin 130 and transistors 133. The negative input of comparator 134 is coupled between resistors 142 and 143. If the voltage Vin+ at the positive input of comparator 134 is higher than the voltage at the negative input of comparator 134 (VCCIO/2), the output voltage of comparator 134 is high.

When the output voltage of comparator 134 is high, 7-bit up/down counter 135 causes its 7 output count signals 139 to count up. The count signals 139 control the gate voltages of the 7 transistors in NMOS transistor group 133. When the binary value of the 7 count signals 139 increases, the effective resistance of NMOS transistor group 133 decreases.

If the voltage Vin+ at the positive input of comparator 134 is less than the voltage at the negative input of comparator 134 (VCCIO/2), the output voltage of comparator 134 is low. When the output voltage of comparator 134 is low, the binary value of count signals 139 decreases, causing the effective resistance of NMOS group 133 to increase.

The voltage Vin+ eventually oscillates across the VCCIO/2 threshold level as discussed above with respect to circuit 101. A pattern detect circuit 136 detects the toggling output voltage of comparator 134 and enables register 138 to latch the values of count signals 139. FIG. 3 illustrates an example of pattern detect circuit 136.

The output signal of pattern detect circuit 136 transitions from low to high when it detects the output voltage of comparator 134 satisfies the logic function of logic block 320. The output of circuit 136 is coupled to the enable input of register 138. Register 138 includes 7 serially coupled flip-flops that store the 7 count signals OCTCALN[6:0] on a rising edge of the output signal of pattern detect circuit 136. Count signals OCTCALN[6:0] can be transmitted through multiplexer 119 to IO buffer 100 to control the termination resistance of transistors in NMOS group 121, as discussed above.

Multiplexer 119 can be set to select the OCTCALN[6:0] signals when a user wants the termination resistance of NMOS group 121 to match the resistance of external resistor 131. When multiplexer 119 selects OCTCALN[6:0], NMOS group 121 has the same effective resistance as NMOS group 133, which is set to match resistor 131. When matching the resistance of NMOS group 121 to resistor 131, calibration circuit 102 compensates for silicon process, voltage, and temperature (PVT) variations on the integrated circuit. As a result, calibration circuit 102 can achieve a very accurate termination resistance (e.g., a 10% variation).

Figure 4:
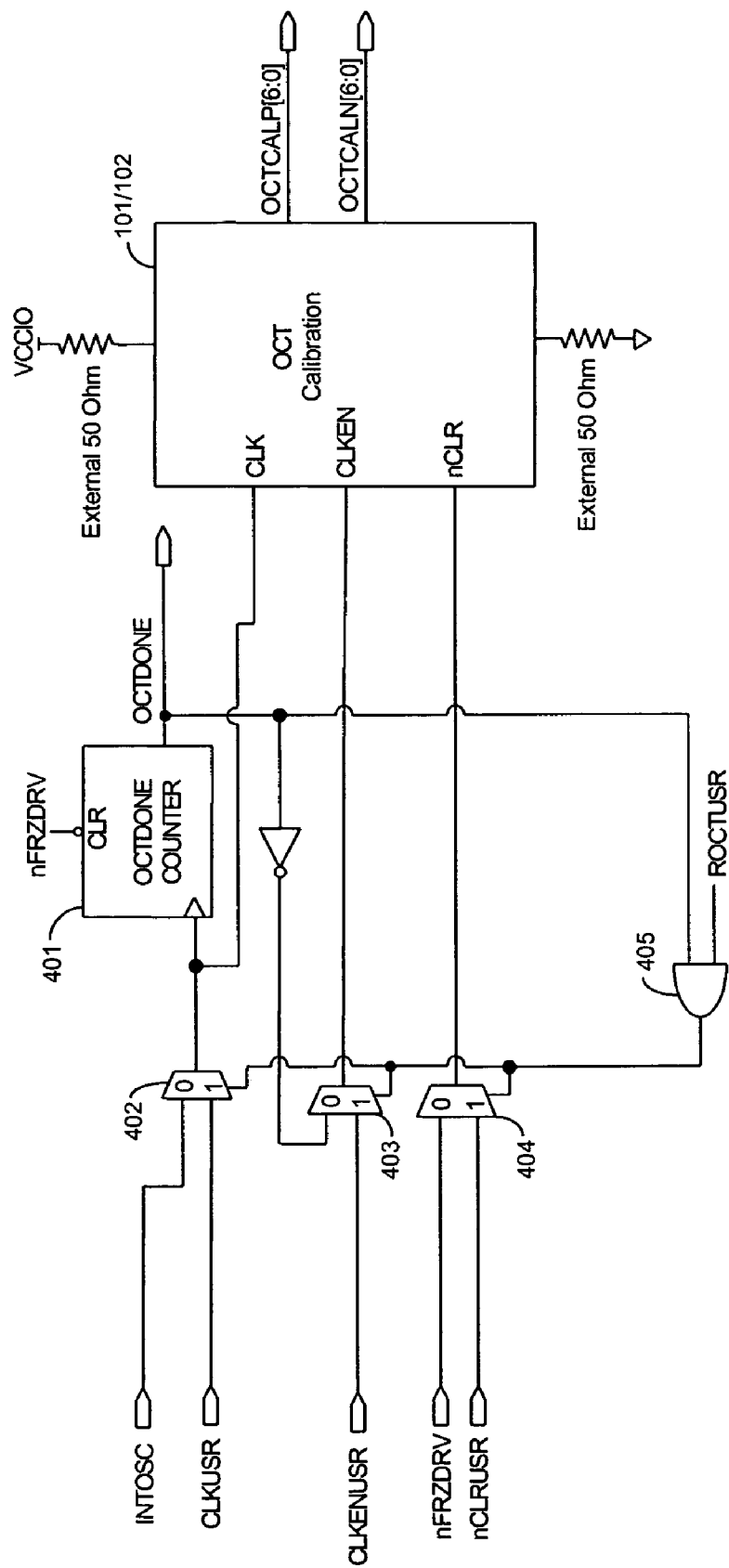
FIG. 4 illustrates an on-chip termination calibration interface, according to an embodiment of the present invention.

FIG. 4 shows an on-chip termination (OCT) calibration interface. Signals INTOSC, nFRZDRV and OCTDONE are generated by a programmable logic device (PLD) control block. Signals CLKUSR, CLKENUSR, and nCLRUSR are generated by the PLD core programmable logic. Signals OCTCALP[6:0] and OCTCALN[6:0] are generated by calibration circuits 101 and 102.

By default, the on-chip termination is calibrated after the PLD CRAM bit configuration is completed, but before the PLD enters user mode. The on-chip termination (OCT) is also controlled by OCTDONE counter 401. Counter 401 usually counts 256 cycles, and sets the OCTDONE signal to high to indicate OCT calibration is finished.

When the OCTDONE signal is high, multiplexer 402 selects CLKUSR signal, multiplexer 403 selects the CLKENUSR signal, and multiplexer 404 selects the nCLRUSR signal. The core PLD logic disables the OCT calibration circuits 101/102 by causing the CLKENUSR signal to transition low and the nCLRUSR signal to transition low. Multiplexer 403 couples CLKENUSR to the CLKEN inputs of the calibration circuits. When CLKEN is low, counters 105 and 135 as well as pattern detect circuits 106 and 136 turn off. Multiplexer 404 couples nCLRUSR to the nCLR inputs of the calibration circuits. When nCLR is low, the output signals of the counters and pattern detect circuits are cleared to default values.

If CRAM bit ROCTUSR is low, AND gate 405 blocks the OCTDONE signal from changing the signal at the select inputs of multiplexers 402–404. Also, when ROCTUSR is low and OCTDONE is high, a low voltage is sent to CLKEN, disabling calibration circuits 101 and 102.

The OCTDONE signal is also sent to a PLD control block to enable the PLD to enter user mode. When PLD is in user mode, the user is given the choice to recalibrate OCT if he needs to, because temperature and voltage may drift from the levels when OCT is calibrated during PLD configuration. To calibrate the OCT in user mode, the user needs to provide the CLKUSR, CLKENUSR, and nCLRUSR signals, and set the CRAM bit ROCTUSR to high during PLD configuration. A user may continuously calibrate OCT for as long as needed. To stop calibration, simply stop CLKUSR clock, or set CLKENUSR to low.

Figure 5:
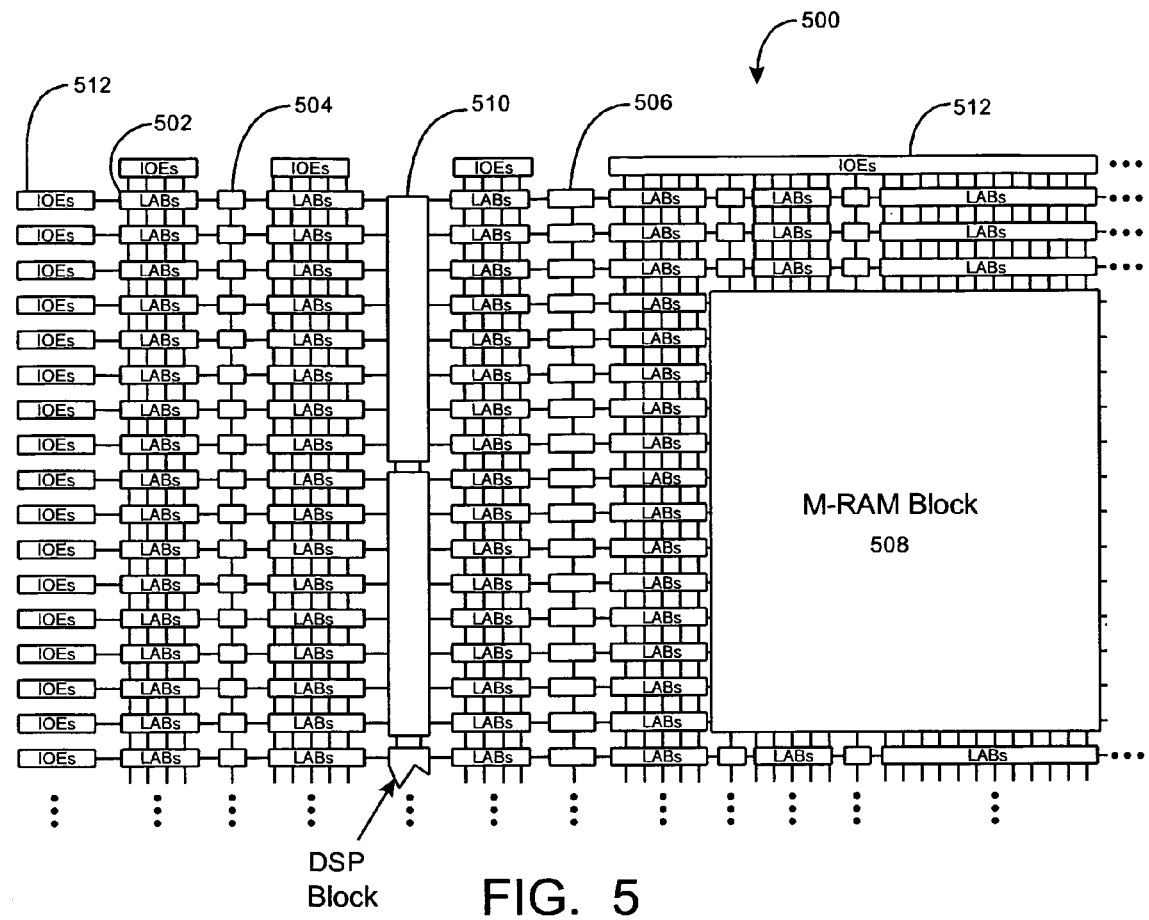
FIG. 5 is a simplified block diagram of a programmable logic device that can be used with the techniques of the present invention.

FIG. 5 is a simplified partial block diagram of one example of PLD 500 that can include aspects of the present invention, including the calibration circuits and the IO buffer of FIG. 1. Although the present invention is discussed in the context of PLDs and FPGAs, it should be understood that the present invention can be applied to numerous types of integrated circuits including programmable logic integrated circuits and application specific integrated circuits (ASICs).

PLD 500 is an example of a programmable logic integrated circuit in which techniques of the present invention can be implemented. PLD 500 includes a two-dimensional array of programmable logic array blocks (or LABs) 502 that are interconnected by a network of column and row interconnects of varying length and speed. LABs 502 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 also includes a distributed memory structure including RAM blocks of varying sizes provided throughout the array. The RAM blocks include, for example, 512 bit blocks 504, 4K blocks 506, and a block 508 providing 512K bits of RAM. These memory blocks can also include shift registers and FIFO buffers.

PLD 500 further includes digital signal processing (DSP) blocks 510 that can implement, for example, multipliers with add or subtract features. I/O elements (IOEs) 512 located, in this example, around the periphery of the device support numerous single-ended and differential I/O standards. It is to be understood that PLD 500 is described herein for illustrative purposes only and that the present invention can be implemented in many different types of PLDs, FPGAs, and the like.

Figure 6:
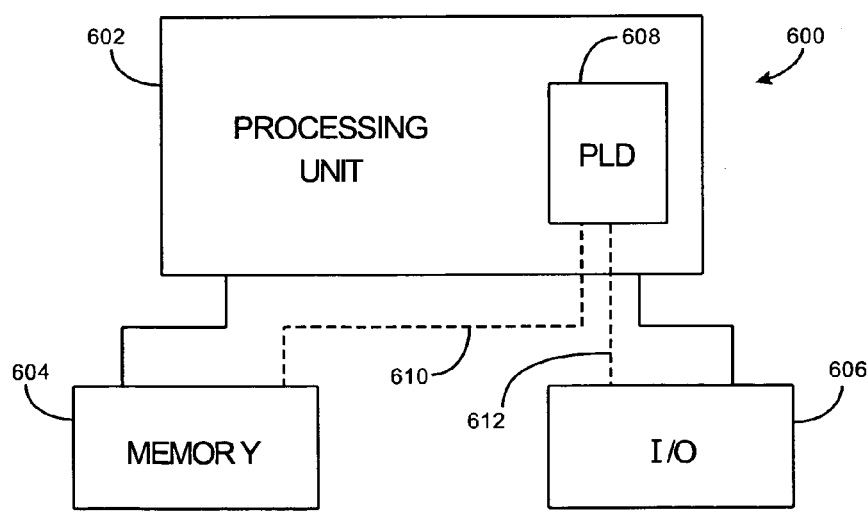
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 600, within which the present invention can be embodied. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604 and an I/O unit 606 interconnected together by one or more buses. According to this exemplary embodiment, a programmable logic device (PLD) 608 is embedded in processing unit 602. PLD 608 can serve many different purposes within the system in FIG. 6. PLD 608 can, for example, be a logical building block of processing unit 602, supporting its internal and external operations. PLD 608 is programmed to implement the logical functions necessary to carry on its particular role in system operation. PLD 608 can be specially coupled to memory 604 through connection 610 and to I/O unit 606 through connection 612.

Processing unit 602 can direct data to an appropriate system component for processing or storage, execute a program stored in memory 604 or receive and transmit data via I/O unit 606, or other similar function. Processing unit 602 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 608 can control the logical operations of the system. In an embodiment, PLD 608 acts as a reconfigurable processor, which can be reprogrammed as needed to handle a particular computing task. Alternately, programmable logic device 608 can itself include an embedded microprocessor. Memory unit 604 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. An integrated circuit comprising a calibration circuit coupled to control a termination resistance in a buffer, the termination resistance coupled to a first pin, the calibration circuit comprising:
   a first group of transistors that are coupled together in parallel;
   a resistor divider;
   a first comparator having a first input coupled to a drain of each of the first group of transistors and a second input coupled to the resistor divider;
   a first counter circuit coupled to an output of the first comparator, the first counter circuit having a plurality of outputs, each coupled to a gate of each of the first group of transistors;
   a first pattern detect circuit coupled to the output of the first comparator; and
   a first register coupled to an output of the first counter circuit and an output of the first pattern detect circuit.

2. The integrated circuit defined in claim 1 wherein the first pattern detect circuit causes its output voltage to change state after detecting a predetermined series of transitions in a voltage at the output of the first comparator.

3. The integrated circuit defined in claim 2 wherein the first counter circuit generates count signals that control gates of the transistors in the first group.

4. The integrated circuit defined in claim 3 wherein the first register stores the count signals in response to a change in the output voltage of the first pattern detect circuit.

5. The integrated circuit defined in claim 4 wherein the first pattern detect circuit causes it output voltage to change state in response to the voltage at the output of the first comparator transitioning from low-to-high-to-low-to-high or from high-to-low-to-high-to-low.

6. The integrated circuit defined in claim 2 further comprising:
   a multiplexer having a first input coupled to an output of the first register, a second input coupled to receive CRAM bits, and an output coupled to the buffer,
   wherein the multiplexer is configured to selectively couple the CRAM bits or signals stored in the first register to control the termination resistance in the buffer.

7. The integrated circuit defined in claim 1 wherein the first group of transistors are coupled to a second pin.

8. The integrated circuit defined in claim 1 wherein the calibration circuit is a first calibration circuit that controls a series termination resistance of second pull-up transistors in the buffer, and the integrated circuit further comprises a second calibration circuit that controls a series termination resistance of third pull-down transistors in the buffer.

9. The integrated circuit defined in claim 8 wherein the second calibration circuit comprises:
   a fourth group of transistors coupled together in parallel and to a second pin;
   a second comparator coupled to the fourth group of transistors;

a second counter circuit coupled to an output of the second comparator;

a second pattern detect circuit coupled to the output of the second comparator; and a second register coupled to an output of the second counter circuit and an output of the second pattern detect circuit.

10. The integrated circuit defined in claim 9 further comprising:

a multiplexer having a first input coupled to an output of the second register, a second input coupled to receive CRAM bits, and an output coupled to the buffer, wherein the multiplexer is configured to selectively couple the CRAM bits or signals stored in the second register to control the series termination resistance of the third pull-down transistors in the buffer.

11. The integrated circuit defined in claim 10 wherein the second pattern detect circuit causes it output voltage to change state in response to an output voltage of the second comparator transitioning from low-to-high-to-low-to-high or from high-to-low-to-high-to-low.

12. The integrated circuit defined in claim 1 wherein the integrated circuit is a programmable integrated circuit that includes an array of programmable logic elements coupled to the buffer.

13. An integrated circuit comprising a calibration circuit configured to control a termination resistance of a first group of transistors coupled to a first pin, the calibration circuit comprising:

means for monitoring a voltage across a second group of transistors coupled together in parallel and providing an output signal having a first polarity when the voltage across the second group of transistors is higher than a first reference voltage and a second polarity when the voltage across the second group of transistors is lower than the first reference voltage;

means for generating count signals in response to the output signal of the means for monitoring;

means for generating a pattern detect signal in response to a predetermined pattern in the polarity of the output signal of the means for monitoring, the predetermined pattern comprising four consecutive bits having alternating polarities;

means for storing the count signals in response to the pattern detect signal; and means for selecting the stored count signals to control the termination resistance of the first group of transistors so that the termination resistance of the first group of transistors matches an effective resistance of the second group of transistors.

14. The integrated circuit defined in claim 13 wherein the second group of transistors are coupled to a second pin.

15. The integrated circuit defined in claim 13 wherein the means for selecting is configured to select CRAM bits to control the termination resistance of the first group of transistors.

16. The integrated circuit defined in claim 13 wherein the calibration circuit is a first calibration circuit and the first group of transistors are pull-up transistors, and the integrated circuit further comprises a third group of pull-down transistors coupled to the first pin and a second calibration circuit configured to control a termination resistance of the third group of transistors.

17. The integrated circuit defined in claim 16 wherein the second calibration circuit comprises:

means for monitoring a voltage across a fourth group of transistors coupled together in parallel and providing an output signal having a first polarity when the voltage across the fourth group of transistors is higher than a second reference voltage and a second polarity when the voltage across the second group of transistors is lower than the second reference voltage;

means for generating second count signals in response to the output signal of the means for monitoring the voltage across the fourth group of transistors;

means for generating a second pattern detect signal in response to the predetermined pattern of digital transitions in the output signal of the means for monitoring the voltage across the fourth group of transistors;

means for storing the second count signals in response to the second pattern detect signal; and means for selecting the stored second count signals to control the termination resistance of the third group of transistors so that the termination resistance of the third group of transistors matches an effective resistance of the fourth group of transistors.

18. A method for controlling a termination resistance in a buffer coupled to a first pin, the method comprising:

monitoring a voltage across a first group of transistors using a comparator;

generating count signals in response to an output signal of the comparator;

selectively enabling the transistors in the first group using the count signals;

detecting a series of digital transitions in the output signal of the comparator using a pattern detect circuit;

storing the count signals in a register in response to an output signal of the pattern detect circuit;

counting a first number of clock cycles, then generating a signal indicating a calibration of the termination resistance in the buffer is complete; and controlling a termination resistance of a second group of transistors in the buffer using the count signals stored in the register.

19. The method defined in claim 18 wherein generating the count signals further comprises increasing a binary value of the count signals when the output signal of the comparator is within a first range, and decreasing a binary value of the count signals when the output signal of the comparator is within a second range.

20. The method defined in claim 18 wherein detecting the series of digital transitions in the output signal of the comparator using the pattern detect circuit further comprises changing the output signal of the pattern detect circuit in response to the output signal of the comparator transitioning from low-to-high-to-low-to-high or from high-to-low-to-high-to-low.

21. The method defined in claim 18 further comprising:

selecting CRAM bits to control the termination resistance of the second group of transistors.

22. The method defined in claim 18 wherein the count signals are first count signals that control a series termination resistance of the second group of transistors in the buffer, and the method further comprises generating second count signals to control a series termination resistance of a third group of transistors in the buffer.

23. The method defined in claim 22 further comprising:

selecting CRAM bits to control the series termination resistance of the third group of transistors.

24. The method defined in claim 18 further comprising:

disabling a first counter circuit that generates the count signals in response to a signal generated by a second counter circuit.

* * * * *